United States Patent [19]

Ishitani et al.

[11] Patent Number: 4,697,086
[45] Date of Patent: Sep. 29, 1987

[54] APPARATUS FOR IMPLANTING ION MICROBEAM

[75] Inventors: Tohru Ishitani, Sayama; Hifumi Tamura, Hachioji; Kaoru Umemura, Kokubunji, all of Japan

[73] Assignee: Hitachi, Ltd., Tokyo, Japan

[21] Appl. No.: 732,759

[22] PCT Filed: Jul. 20, 1984

[86] PCT No.: PCT/JP84/00372
§ 371 Date: Apr. 24, 1985
§ 102(e) Date: Apr. 24, 1985

[87] PCT Pub. No.: WO85/01389
PCT Pub. Date: Mar. 28, 1985

[30] Foreign Application Priority Data

Sep. 14, 1983 [JP] Japan .............................. 58-168137

[51] Int. Cl.$^4$ ...................... H01J 37/317; H01J 37/20
[52] U.S. Cl. ............................... 250/492.2; 250/396 R
[58] Field of Search ................. 250/492.21, 309, 296, 250/396 R

[56] References Cited

U.S. PATENT DOCUMENTS 4,315,153  2/1982  Vahrenkamp ................. 250/492.21

Primary Examiner—Craig E. Church
Assistant Examiner—Jack I. Berman
Attorney, Agent, or Firm—Antonelli, Terry & Wands

[57] ABSTRACT

An apparatus for implanting an ion microbeam consists of an ion source; a beam-focusing system which accelerates ions emitted from the ion source, focuses the ions, separates the ions by mass, and deflects the ions; and a sample plate which minutely moves a sample. A Wien filter in which a uniform electric field intersects a uniform magnetic field at right angles is used to separate the ions by mass in the beam-focusing system. A linear optical axis is bent in the Wien filter so that the axis of the ion beam emitted from the ion source intersects the axis of an ion beam implanted into the sample.

2 Claims, 5 Drawing Figures

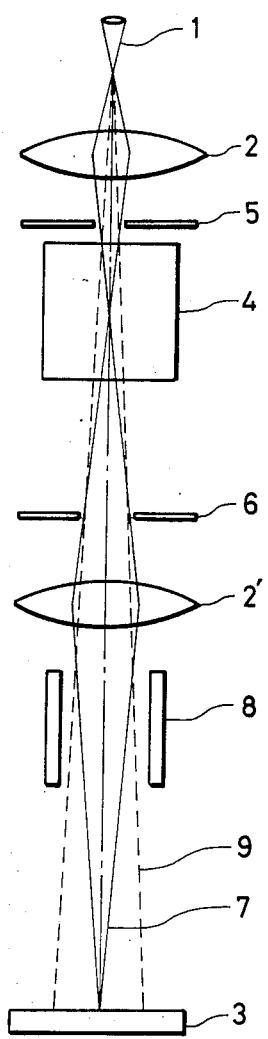
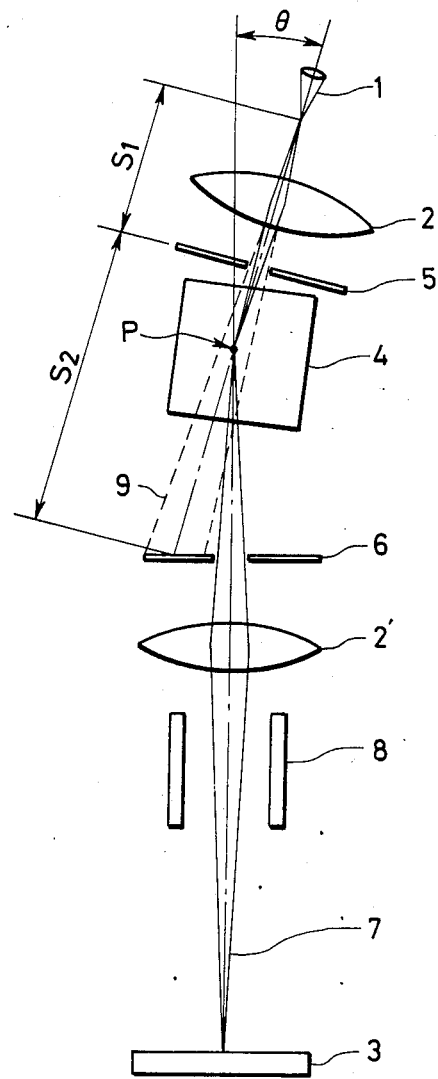
FIG. 1
(PRIOR ART)
FIG. 3

(a)  (b)

APPARATUS FOR IMPLANTING ION MICROBEAM

TECHNICAL FIELD

The present invention relates to an improvement in an apparatus for implanting ions which describes patterns directly onto a sample substrate using an ion microbeam.

BACKGROUND ART

FIG. 1 schematically shows the structure of a typical conventional apparatus implanting an ion microbeam. In FIG. 1, ions emitted from an ion source 1 are accelerated and focused onto a sample 3 by a pair of electrostatic lenses 2, 2'. An EXB (Wien) filter 4 is placed between the two lenses 2 and 2', so that the desired ion seeds can only travel straight through the Wien filter 4, and pass through an iris 6. FIG. 2 shows the Wien filter 4 in detail. In the Wien filter 4, a uniform electric field E is produced by parallel electrodes 10, 11, and a uniform magnetic field B is produced by magnetic poles 12, 13. When monovalent ions of a mass M are accelerated at an acceleration voltage $V_0$ and travel straight through the filter 4 to form an ion beam 14, the following is the relationship between the mass M, acceleration voltage $V_0$, uniform electric field E, and uniform magnetic field B:

$$(2eV_0/M)^{\frac{1}{2}} = E/B \quad (1)$$

where e is a unit electric charge.

Only those ions which have a mass that satisfies Equation (1) are able to pass through the Wien filter. Ions lighter than these ions which are travelling straight travel along a light path 15, and heavier ions travel along a light path 16, so that, none of these ions are able to pass through the iris 6. The focused beam 7 is deflected by a beam deflector 8 to scan the sample 3. In the apparatus of FIG. 1, since the ion optical axis is straight, neutral particles emitted from the ion source 1 are not affected by electromagnetic field of the beam-focusing system, reach the sample 3 in the form of a diverging beam 9, as indicated by the broken lines, and contaminate the sample 3. The degree of sample contamination can be calculated roughly as described below. In an apparatus for implanting an ion microbeam, a liquid metal ion source is usually used as the ion source 1. A single metal or an alloy containing the desired ion seeds is employed as the ion material, it is heated to a temperature above its melting point in the ion source 1 so that it melts. During this time, a quantity of neutral particles corresponding to the vapor pressure of the molten metal are emitted from the end of the ion emitter, and reach the sample 3.

If the temperature of the molten metal is denoted by T[°K.], the vapor pressure at this temperature by P [Torr], the atomic weight of the emitted neutral particles by M [amu], the area of the vaporization region at the end of the ion emitter by S [cm$^2$], and the distance from the end of the emitter to the sample 3 by L [cm], the degree of contamination N [atoms/cm$^2$.sec] of the sample 3 by the vaporized particles, is given by the relationship:

$$N = 3.51 \times 10^{22} [P/(MT)^{\frac{1}{2}}][S/\pi L^2] \cdot a \quad (2)$$

where a is the probability that vaporized particles will adhere to the surface of the sample, and is approximately 1.

For instance, with a liquid metal ion source using gold as the ion material, the melting point $T_m$ is 1336° K., and the vapor pressure P is $10^{-4}$ Torr at a temperature of T=1413° K. Gold has an atomic weight of M=197 amu. If the area is $S=1\times10^{-2}$ cm$^2$ and the distance is L=40 cm, Equation (1) shows that the degree of contamination N is $1.33\times10^{10}$ atoms/cm$^2$.sec. If converted into a current density, this value becomes $2.1\times10^{-9}$ A/cm$^2$.

However, this value only concerns atoms vaporized from the ion source 1 as neutral particles, it does not include the neutral particles that are generated by the conversion of electric charge as emitted ions are travelling.

The sample is particularly contaminated when a high concentration of ions is implanted, i.e., when the beam is irradiated for an extended period of time, when a material with a high vapor pressure is used as the ion material in the ion source 1, or when there are impurities therein.

SUMMARY OF THE INVENTION

An object of the present invention is to provide an apparatus for implanting an ion microbeam which is able to protect the samples from contamination from neutral particles emitted from the ion source.

In order to achieve this object, the present invention deals with an apparatus for implanting an ion microbeam which comprises an ion source, a beam-focusing system which accelerates ions emitted from the ion source, focuses the ions, separates ions by mass, and deflects the ions, and a sample plate which moves a sample very precisely; the apparatus being improved so that use is made of a Wien filter in which a uniform electric field intersects a uniform magnetic field at right angles to separate ions in the beam-focusing system according to mass, and the linear optical axis of the beam-focusing system is bent within the Wien filter.

BRIEF DESCRIPTION OF DRAWINGS

FIG. 1 is a diagram of the fundamental structure of a conventional apparatus for implanting an ion microbeam;

FIG. 3 is a diagram of the fundamental structure of an apparatus for implanting an ion microbeam according to an embodiment of the present invention;

DETAILED DESCRIPTION OF THE PREFERRED EMBODIMENTS

Figure 2:
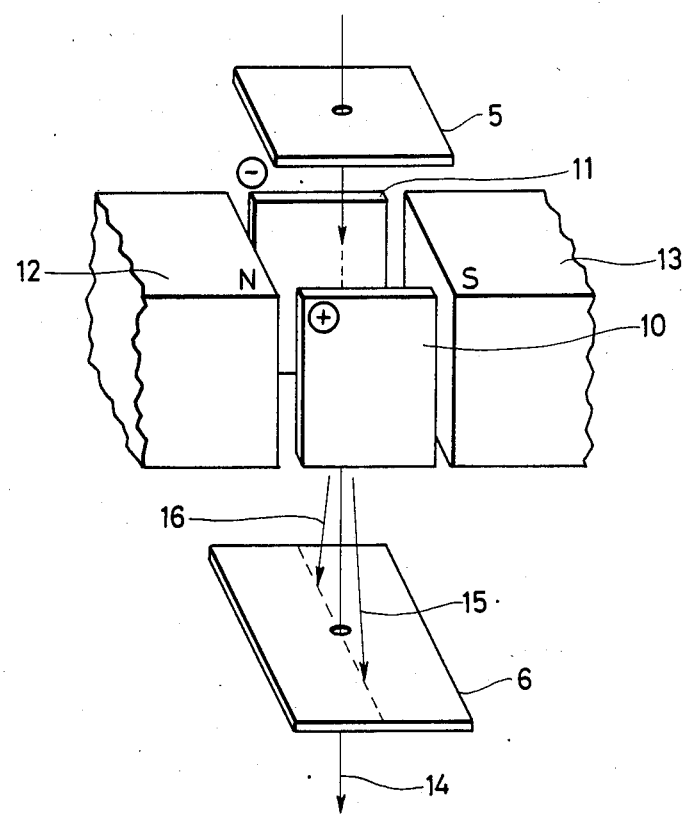
FIG. 2 is a diagram of a specific structure of a Wien filter.
Figure 4:
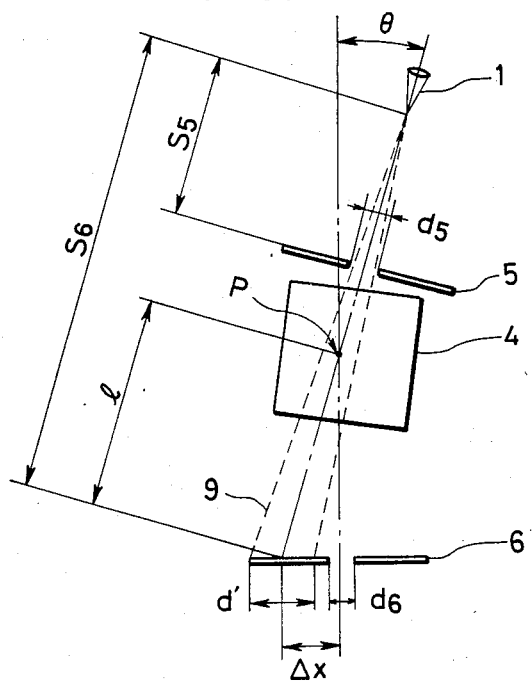
FIG. 4 is a diagram of the portion of the apparatus of FIG. 3 which bends the optical axis, illustrating the removal of a beam of neutral particles.

An embodiment of the present invention will be described below with reference to FIG. 3. An axis along which ions are emitted from the ion source 1 intersects an axis along which ions are implanted into the sample 3 at an angle $\theta$, and an intersection point P thereof is positioned at the center of the optical path within the EXB (Wien) filter 4. FIG. 4 shows in detail the structure of this portion, illustrating means for removing neutral particles emitted from the ion source 1.

The beam 9 of neutral particles does not bend at the point P, but continues straight on, and the diameter d' thereof on the iris 6 is determined by the projection of diameter $d_5$ of another iris 5. The distances from the ion source 1 to the irises 5, 6 are denoted by $S_5$ and $S_6$, respectively. In this embodiment, the angle $\theta$ is $1.75 \times 10^{-2}$ rad [approximately one degree], so that the approximation $\theta \simeq \sin \theta \simeq \tan \theta$ holds. Therefore, the relationship between the diameter d' and the diameter $d_5$ is:

$$d' \simeq (S_6/S_5)d_5 \qquad (3)$$

If the distance from the point P to the iris 6 is denoted by l, the distance $\Delta x$ of a point where neutral particles reach from the center of iris 6, is given by:

$$\Delta x \simeq l \cdot \theta \qquad (4)$$

The iris 6 has a hole of diameter $d_6$ at the center thereof to enable the passage of the beam of desired ion seeds. To prevent the beam 9 of neutral particles passing through this hole, the following requirement must be satisfied:

$$\Delta x > (d' + d_6)/2 \qquad (5)$$

In this embodiment, $d_5 = d_6 = 0.5$ mm, $S_5 = 100$ mm, $S_6 = 260$ mm, $l = 170$ mm, $\theta = 3.5 \times 10^{-2}$ rad, therefore if, $\Delta x = 2.97$ mm, $d' = 1.3$ mm, Equation (5) is satisfied.

The reason why the intersection point P of the two optical axes is positioned at the center of the EXB filter is because the positioning of the focusing point of the beam by the lens 2 at the center of the EXB filter 4, as shown in FIGS. 1 and 3, is convenient for the formation of a microbeam, because of aberrations in the filter. This embodiment preserves this convenient feature.

If the beam trajectory is bent by the action of the electric field E and the magnetic field B in the EXB filter 4, simply to shift the optical axis, then the bending point P of the optical axis can be at any position within the EXB filter 4.

Figure 5:
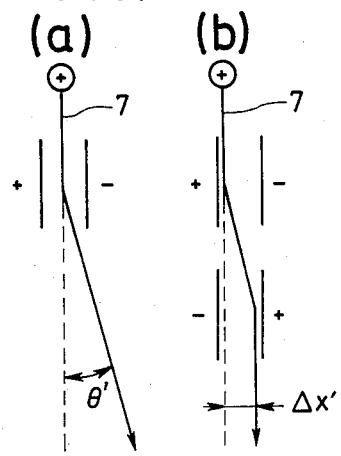
FIGS. 5(a) and 5(b) are diagrams of means for bending the optical axis using beam deflector plates and means for shifting the optical axis, respectively.

If an attempt is made to bend or shift the optical axis by the electric field E with the point P positioned outside the EXB filter 4, one or two pairs of beam deflector plates are necessary, as shown in FIGS. 5(a) and 5(b).

According to the present invention, the same effects can be obtained by utilizing the EXB of the EXB filter 4 which separates masses, without the need of providing the additional beam deflector plates of FIGS. 5(a) and 5(b).

In the EXB filter 4 of the present invention, the optical axis of the beam is bent through an angle $\theta$ at the inlet and the outlet of the filter, but the angle $\theta$ is as small as a few tens of mrad, and the deterioration in the performance of the EXB filter due to the bending of the optical axis is negligibly small.

In a conventional apparatus based upon a liquid metal ion source using gold as the ion material, samples were found to be contaminated to a degree of between $10^{13}$ to $10^{14}$ atoms/cm$^2$ per hour. With the apparatus of the present invention, on the other hand, no contamination was detected, and it was found that the degree of contamination was improved to at most $10^{10}$ atoms/cm$^2$.

According to the present invention described above, it is possible to produce high-performance semiconductor devices, since samples are protected from contamination from neutral particles emitted from the ion source in a step of implanting an ion microbeam. The present invention can also be applied to the exposure of a resist to an ion beam.

We claim:

1. An apparatus for implanting an ion microbeam comprising an ion source; beamfocusing means for accelerating ions emitted from said ion source, focusing said ions, separating said ions by mass, and deflecting said ions; and a sample stage which minutely moves a sample; said means including a Wien filter in which a uniform electric field intersects a uniform magnetic field at right angles so as to separate said ions in said beamfocusing means according to mass; said beamfocusing means focusing said ions so that a focusing point of said ions is within said Wien filter; and a linear optical axis of said beam-focusing means is bent within said Wien filter; wherein the point at which said optical axis bends coincides with said focusing point of said ions.

2. The apparatus for implanting an ion microbeam according to claim 1, wherein the point at which said optical axis bends is near the center of said Wien filter.

* * * * *